(12) United States Patent
Kondo et al.

(10) Patent No.: US 8,130,497 B2
(45) Date of Patent: Mar. 6, 2012

(54) BLADE SERVER

(75) Inventors: Yoshihiro Kondo, Tsuchiura (JP);
Tadakatsu Nakajima, Kasumigaura (JP); Akio Idei, Hatano (JP); Shigeyasu Tsubaki, Odawara (JP); Hiroyuki Toyoda, Mito (JP); Tomoo Hayashi, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/620,742

(22) Filed: Nov. 18, 2009

(65) Prior Publication Data

US 2010/0124012 A1    May 20, 2010

(30) Foreign Application Priority Data

Nov. 19, 2008 (JP) ................................ 2008-295703

(51) Int. Cl.
*H05K 7/20* (2006.01)

(52) U.S. Cl. ........ 361/700; 361/699; 361/716; 361/719; 361/721; 174/15.2; 165/80.4; 165/104.26; 165/104.33

(58) Field of Classification Search .................. None
See application file for complete search history.

(56) References Cited

U.S. PATENT DOCUMENTS

| | | | |
|---|---|---|---|
| 6,466,441 B1 * | 10/2002 | Suzuki | 361/695 |
| 6,778,394 B2 * | 8/2004 | Oikawa et al. | 361/700 |
| 6,840,304 B1 * | 1/2005 | Kobayashi et al. | 165/11.1 |
| 7,012,807 B2 * | 3/2006 | Chu et al. | 361/699 |
| 7,231,961 B2 * | 6/2007 | Alex et al. | 165/80.4 |
| 7,327,571 B2 * | 2/2008 | Giardina et al. | 361/700 |
| 7,372,698 B1 * | 5/2008 | Tilton et al. | 361/701 |
| 7,599,184 B2 * | 10/2009 | Upadhya et al. | 361/699 |
| 7,701,714 B2 * | 4/2010 | Shabany | 361/698 |
| 7,719,837 B2 * | 5/2010 | Wu et al. | 361/699 |
| 2006/0185826 A1 * | 8/2006 | Ohashi | 165/104.24 |
| 2008/0259566 A1 * | 10/2008 | Fried | 361/699 |
| 2009/0027856 A1 * | 1/2009 | McCoy | 361/699 |

FOREIGN PATENT DOCUMENTS

| | | |
|---|---|---|
| JP | 2001-66080 | 3/2001 |
| JP | 2006-12875 | 1/2006 |
| JP | 2007-263427 | 10/2007 |

* cited by examiner

*Primary Examiner* — Boris Chervinsky
(74) *Attorney, Agent, or Firm* — Antonelli, Terry, Stout & Kraus, LLP.

(57) ABSTRACT

A server system with a cooling ability that can cope with an increase in the amount of heat generated by a CPU of a server module detachably mounted on a blade server. The server module includes an enclosure accommodating therein a motherboard on which a CPU, memory, and the like are mounted, and part of a boil cooling device for cooling heat generated by the CPU. A fan accommodated in a fan module is adapted to blow air into the server module through an opening of the server module enclosure. The boil cooling device includes a first heat transmission member disposed in the server module enclosure, a second heat transmission member disposed outside the server module enclosure, and a plurality of pipes connecting them. The first heat transmission member is a box body with an internal space for hermetically sealing a refrigerant therein, one external planar face of which is thermally connected to the CPU and the other external planar face of which is provided with a heat sink. The second heat transmission member is disposed in the fan module unit, and a heat radiation member provided for the pipes forms an airflow passage together with the motherboard.

7 Claims, 3 Drawing Sheets

TOP VIEW

FRONT VIEW

TOP VIEW

M: Length of heat sink fin
N: Offset of the inlet over the horizontal portion of the first heat transfer pipe

SIDE VIEW

BLADE SERVER

BACKGROUND OF THE INVENTION

1. Field of the Invention

The present invention relates to cooling a server module, and in particular, it relates to a server system (a blade server) that can optimally perform cooling in response to an increase in the amount of heat generated by semiconductor devices.

2. Background Art

In electronic apparatuses such as computers with CPUs mounted thereon, the amount of heat generated by semiconductor devices such as the CPUs has been increasing with an increase in the volume of information as well as the processing speed of information. Heat generated by semiconductor devices not only hinders the intended performance of the semiconductor devices but can cause self-destruction of the semiconductor devices. Therefore, an electronic apparatus such as a computer that uses semiconductor devices is provided with a cooling device for cooling heat generators such as the semiconductor devices, in order to keep the semiconductor devices at an optimal temperature.

Reference 1 (JP Published Patent Application No. 2006-12875 A) discloses an electronic apparatus having a refrigerant-circulating cooling device that is thought to have a higher cooling ability than the conventional air-cooling devices in response to an increase in the amount of heat generated by semiconductor devices of a server system (1U server).

References 2 (JP Published Patent Application No. 2001-66080 A) discloses an invention related to a loop type heat pipe that can be used for cooling semiconductor devices. Reference 3 (JP Published Patent Application No. 2007-263427 A) discloses a technique related to a loop type heat pipe used for cooling semiconductors or Peltier devices of electronic apparatuses.

SUMMARY OF THE INVENTION

A server module to be mounted on a blade server is detachably and exchangeably disposed within the enclosure of the blade server according to the needs for information processing. When such a mounted server module includes a CPU with an increased amount of heat generated thereby, it is necessary to provide a cooling device that has a cooling ability corresponding to the increased amount of heat generated by the CPU. However, since the size of the server module cannot easily be changed, it is necessary to use a compact, high-performance cooling device.

As a compact, high-performance cooling device, there is known a boil cooling system that uses latent heat of a refrigerant. For such a system, a structure in which a refrigerant is circulated through a loop circulation passage has been studied, focusing on the stable cooling performance.

Reference 1 relates to an invention of a cooling device for a semiconductor device, the cooling device being mountable on a 1U server as a cooling device that can cope with high heat generation within a limited space. Specifically, an evaporator and a condenser for cooling a CPU are connected to a closed circuit by piping, and the condenser, which is cooled with a fan and is divided into a main condenser and an auxiliary condenser, is disposed on the evaporator.

However, in the technique disclosed in Reference 1, since the cooling device including the evaporator, the condenser, and the fan is disposed within the 1U server, the sizes of the condenser and the fan are limited. Further, since cooling of the other heat generators within the 1U server is inhibited, it is concerned that the CPU may be adversely affected by the temperature rise of the other heat generators. However, no countermeasure against such concerns has been taken.

Reference 2 relates to an invention of a loop type heat pipe in which a pipe encapsulating a working fluid is coupled in a loop configuration, and a condenser, a liquid pool pipe, and an evaporator are sequentially disposed from above in the direction of gravity. The evaporator has an evaporated-working-fluid outlet which is disposed at a higher level than a liquid-working-fluid inlet thereof, whereby reverse flow of the working fluid through the thermosiphon heat pipe is avoided.

However, in the technique disclosed in Reference 2, since a refrigerant circulation passage is formed with a single loop pipe, it is concerned that in the inlet and outlet of each of the evaporator and the condenser, heat conduction resistance that could reduce heat from the evaporator to the pipe may be generated, and conversely, heat conduction resistance that could increase heat from the pipe to the condenser may be generated, which in turn would require an increase in the size of the evaporator and the condenser for transferring a predetermined amount of heat. This is problematic for a cooling device of a server module with a limited space.

Reference 3 relates to an invention of a loop type heat pipe. Specifically, Reference 3 describes that a condenser passage is formed with a plurality of capillary tubes to achieve condensation in a short passage, and an evaporator has a thin double-layer structure to improve efficiency, whereby a compact loop-type heat pipe can be provided.

However, Reference 3 does not describe the specific mounting positions for the module and other heat generators, and does not take into account the effective use of cold air from the fan to the condenser or an improvement in the performance of the condenser.

In order to solve the aforementioned problems, a blade server of the present invention, on which a plurality of server modules and one or more fan modules are mountable, includes an enclosure, the enclosure accommodating therein a motherboard on which electronic components such as a CPU, a memory, and a semiconductor device chip set are mounted, and a part of a boil cooling device for cooling heat generated by the CPU. A fan accommodated in a fan module unit is adapted to blow air into the server module through the openings of the server module enclosure. The boil cooling device includes a first heat transmission member disposed in the server module enclosure, a second heat transmission member disposed outside the server module enclosure, and first and second pipes that connect the first heat transmission member and the second heat transmission member. The first heat transmission member is a box body with an internal space for hermetically sealing a refrigerant therein, one external planar face of the box body being thermally connected to the CPU, and the other external planar face opposite thereto being provided with a heat sink. The second heat transmission member is disposed in the fan module unit, and a heat radiation member, which is provided for the first and second pipes, and the motherboard together form an airflow passage of the fan module. A vaporized refrigerant flows from the first heat transmission member to the second heat transmission member through the first pipe, and a liquefied refrigerant flows from the second heat transmission member to the first heat transmission member through the second pipe.

The present invention with the aforementioned structure can realize a blade server with a compact, high-performance cooling device. Thus, it is possible to provide a server system with a cooling ability that can cope with an increase in the amount of heat generated by a CPU of a server module.

DESCRIPTION OF SYMBOLS

1 SERVER SYSTEM
2 BLADE SERVER
3 SERVER MODULE
4 FAN MODULE
5 CPU
6 MEMORY
7 SEMICONDUCTOR DEVICE CHIP SET
8 MOTHERBOARD
9 COOLING DEVICE
91 EVAPORATOR
92 CONDENSER
93 FIRST HEAT TRANSFER PIPE
94 SECOND HEAT TRANSFER PIPE
95 HEAT SINK
96 HEAT RADIATION MEMBER
100 POWER SUPPLY MODULE
101 I/O MODULE
102 MANAGEMENT MODULE
103 ELECTRONIC SUBSTRATE

DETAILED DESCRIPTION OF THE PREFERRED EMBODIMENTS

Figure 1:
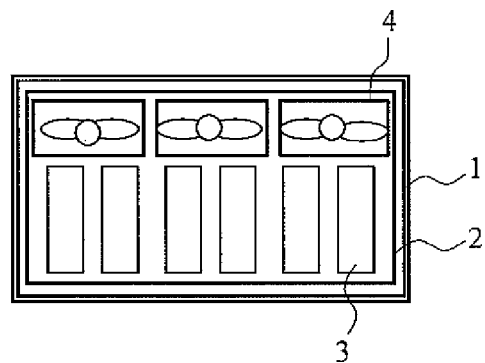
FIG. 1 is a schematic structural view of a server system in accordance with the present invention.
Figure 1:
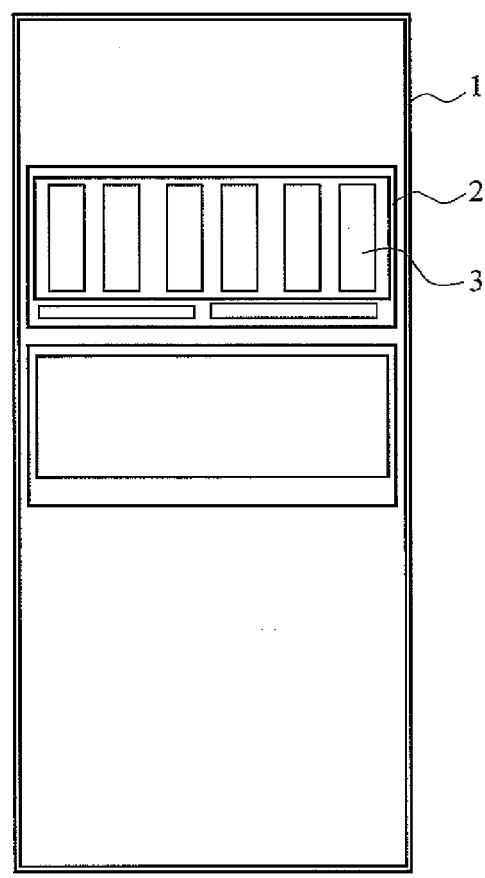

Hereinafter, embodiments of the present invention will be described in detail with reference to the accompanying drawings. FIG. 1 shows the schematic structure (top view and front view) of a server system in accordance with the present invention. As shown in FIG. 1, a server system 1 accommodates therein a blade server 2 as well as other devices (not shown). On the blade server 2, a plurality of server modules 3 are detachably mounted (details will be described later). Fan modules 4 for cooling heat generators and the like of the server modules 3 are disposed on the rear part of the blade server 2.

Figure 2:
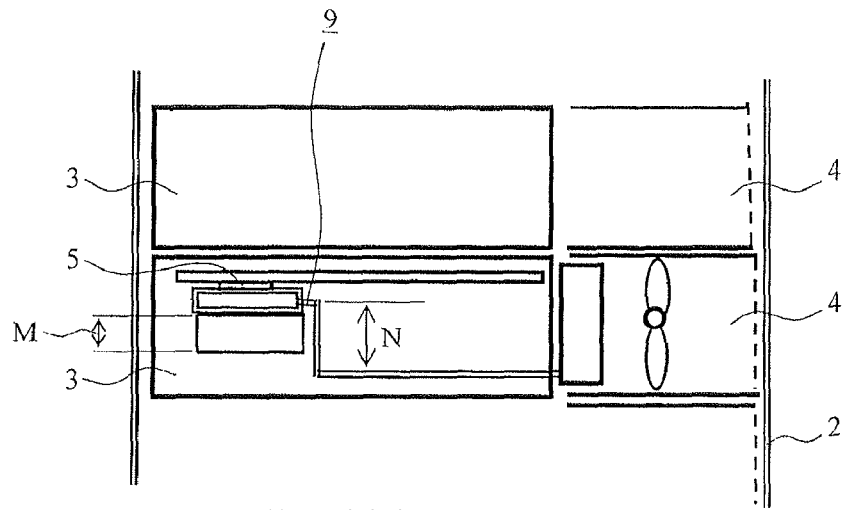
FIG. 2 is a cross-sectional view of the structure of a blade server in a server system in accordance with the present invention.
Figure 2:
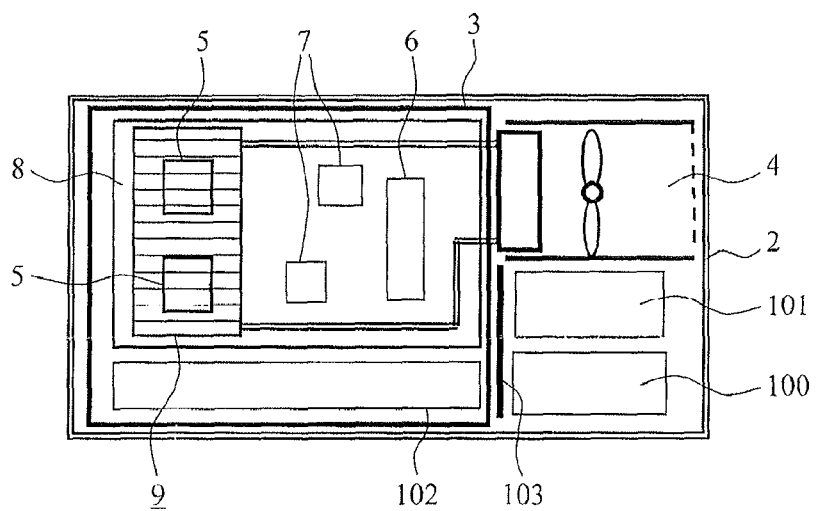

FIG. 2 shows the cross-section (top view and side view) of the blade server in accordance with the present invention. As described previously, the blade server 2 includes the server modules 3 and the fan modules 4 as shown in FIG. 2. The blade server also includes a power supply module 100, a data communication I/O module 101, and a management module 102 for managing/controlling the server module. Such electronic components also generate heat. Thus, they are cooled with fans (not shown).

The embodiment shown in FIG. 2 is an example in which a single fan module 4 is provided for each of the plurality of server modules 3, whereas the embodiment shown in FIG. 1 is an example in which a single large fan module is provided for two server modules. In this manner, the correspondence between the fan modules and the server modules can be changed as appropriate.

The server module 3 includes, as shown in FIG. 2, a motherboard 8 on which CPUs 5, a memory 6, chip sets 7 of semiconductor devices, and the like are mounted. In addition, a cooling device 9 for cooling heat generated by the CPUs 5 is mounted.

Figure 3:
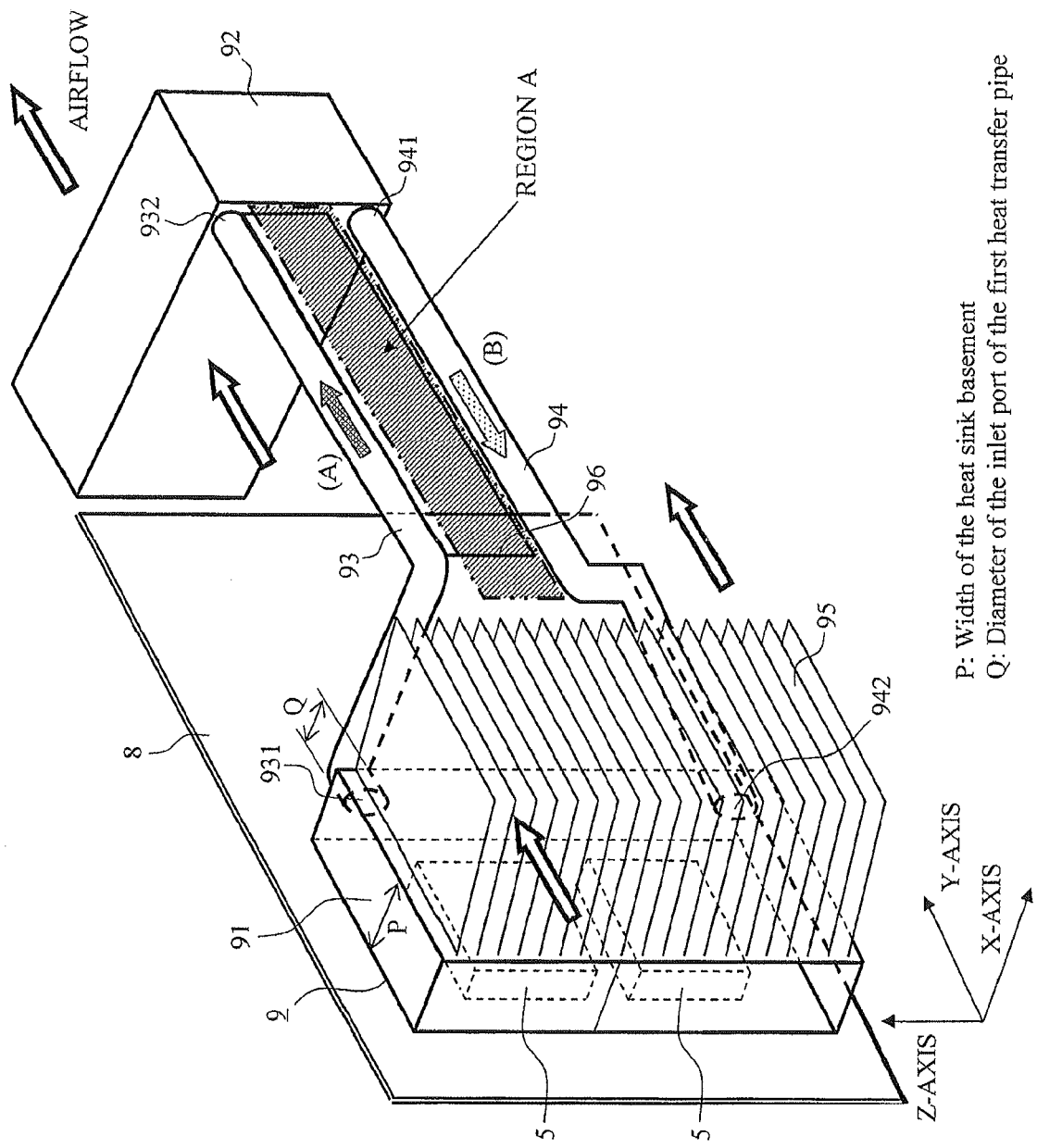
FIG. 3 is a schematic perspective view of the structure of a cooling device in a server system in accordance with the present invention.

FIG. 3 schematically shows the structure of a refrigerant circuit of the cooling device 9 shown in FIG. 2. As shown in FIG. 3, the cooling device 9 cools the heat generated by the two CPUs 5 mounted on the motherboard 8. The cooling device 9 is a boil cooling device that uses the phase change property of refrigerants. The cooling device 9 is thermally connected to the CPUs 5, and includes a first box-shaped heat transmission member (an evaporator) 91 having an internal space for holding a refrigerant therein, a second heat transmission member (a condenser) 92 that cools an evaporated refrigerant with air blown by the fan module 4 to thereby condense it into a liquid, a first heat transfer pipe 93 for circulating a vaporized refrigerant, and a second heat transfer pipe 94 for circulating a liquefied refrigerant.

The evaporator 91 and the condenser 92 are connected to the first heat transfer pipe 93 and the second heat transfer pipe 94, thereby forming a closed circulation passage. A refrigerant circulates such that it flows from the evaporator 91 to the condenser 92 through the first heat transfer pipe 93 (in the direction of the arrow (A)), and then it returns from the condenser 92 to the evaporator 91 through the second heat transfer pipe 94 (in the direction of the arrow (B)).

In the embodiment illustrated herein, the cooling device 9 is used with its XY plane positioned horizontally. In this case, a vaporized-refrigerant outlet 932 of the first heat transfer pipe 93 is disposed at a higher level than a vaporized-refrigerant inlet 931 in the Z-axis direction, and a liquefied-refrigerant outlet 942 of the second heat transfer pipe 94 is disposed at a lower level than a liquefied-refrigerant inlet 941 in the Z-axis direction. Meanwhile, when the cooling device 9 is used with its ZY plane positioned horizontally, the vaporized-refrigerant outlet 932 of the first heat transfer pipe 93 is disposed at a higher level than the vaporized-refrigerant inlet 931 in the X-axis direction, and the liquefied-refrigerant outlet 942 of the second heat transfer pipe 94 is disposed at a lower level than the liquefied-refrigerant inlet 941 in the X-axis direction.

The positional relationship between the two transfer pipes 93 and 94 and the cooling device 9 or the condenser 92 is as described above. Thus, the thermosiphon operation of the refrigerant can be smoothly carried out.

FIGS. 2 and 3 also illustrate that the length of the heat sink fin M is smaller that offset of the vaporized-refrigerant inlet port N from the horizontal portion of the first heat transfer pipe 93. Also, that the diameter of the vaporized-refrigerant inlet port Q of the first heat transfer pipe 93 is smaller that the width P of the heat sink basement.

The evaporator 91 is made of a highly heat conductive metal material such as copper, aluminum, or ceramic. A heat sink 95 with fins is formed on the side of the evaporator 91 opposite from a plane that is thermally connected to the CPUs 5.

Next, cooling of the CPUs 5 with the cooling device 9 will be described. The evaporator 91 thermally connected to the CPUs 5 is a box body made of a highly heat conductive material and having an internal space. The refrigerant is a liquid refrigerant with a volume that is about half that of the internal space of the evaporator 91.

When the server module 3 is disposed with its XY plane positioned horizontally and with its Z-axis facing upwards as shown in FIG. 3 and when the server module is not in operation, the evaporator portion of the upper CPU 5 contains no liquid refrigerant.

To the contrary, when the server module has just started to operate or when the amount of heat generated by the CPUs 5 is small, the heat generated by the lower CPU 5 is first transmitted to the box body portion of the evaporator 91, and is then transmitted to the heat sink 95 disposed on the evaporator 91. Meanwhile, the heat generated by the upper CPU 5 is first transmitted to the box body portion of the evaporator 91, and is then transmitted to the entire box body portion of the evaporator 91 as well as to the heat sink 95 disposed on the evaporator 91. Accordingly, the heat generated by the upper and lower CPUs 5 is transmitted to airflow via the heat sink 95, and thus is radiated.

Further, upon increase of the amount of heat generated by the CPUs 5, a liquid refrigerant is boiled by the heat of the lower CPU 5, and thus vaporizes. The thus vaporized refrigerant is thermally transmitted as latent heat. In addition, boiling of the liquid refrigerant by the lower CPU 5 causes a part of the liquid refrigerant to be blown up, and the thus blown-up liquid refrigerant makes contact with the heated upper CPU 5, whereupon the liquid refrigerant instantaneously turns into vapor. Thus, it is also thermally transmitted as latent heat. The vaporized refrigerant is transferred from the upper portion of the evaporator 91 to the condenser 92 via the first heat transfer pipe 93. The vaporized refrigerant that has flowed into the condenser 92 is cooled in the fan module by heat exchange with the airflow shown by the hollow arrows, and thus undergoes a change in phase into a liquid.

In order to increase the cooling efficiency of the vaporized refrigerant by the airflow in the fan module 4, the condenser 92 is formed to be substantially the same in shape as the fan module 4, and the condenser 92 is joined to the fan module 4 by insertion through an opening provided in the electronic substrate 103 that electrically connects the server module, the fan module, and the like.

Further, it is also possible to dispose the first heat transfer pipe 93 and the second heat transfer pipe 94 on opposite sides of the motherboard 8 and dispose a heat radiation member 96 (e.g., a radiation plate or radiation fins), which is made of a highly heat conductive material and is thermally connected to the first heat transfer pipe 93, in a position indicated by a hatched region A in FIG. 3. In this case, the motherboard 8 and the heat radiation member 96 together form opposite sides of an airflow passage leading to the condenser in the fan module 4.

By forming an airflow passage as described above, it is possible to prevent the leakage of cooling air and further increase the heat radiation area with the heat radiation member 96. Thus, it is possible to promote cooling of the vaporized refrigerant by heat radiation through the first heat transfer pipe 93 and hence increase the cooling effect. In this case, it is preferable, though not shown, in order to prevent the refrigerant condensed in the first heat transfer pipe 93 from blocking the circulation of the vaporized refrigerant, to arrange the second heat transfer pipe 94 to partially communicate with the first heat transfer pipe 93 at a predetermined position between the evaporator 91 and the condenser 92 to thereby make the condensed refrigerant in the first heat transfer pipe 93 be bypassed to the second heat transfer pipe 94 at an earlier stage, and hence return to the evaporator 91.

With the aforementioned structure, it is possible even for a blade server with a limited shape to cool a server module having a CPU with an increased amount of heat generated thereby. Thus, an electronic apparatus on which a variety of server modules can be detachably mounted can be provided.

What is claimed is:

1. A blade server on which a plurality of server modules and one or more fan modules are mountable,
   wherein:
   each of the server modules comprises an enclosure, the enclosure accommodating therein a motherboard on which electronic components including a CPU, a memory, and a semiconductor device chip set are mounted, and a part of a boil cooling device for cooling heat generated by the CPU,
   a fan accommodated in a fan module unit is adapted to blow air into the server module through the server module enclosure,
   the boil cooling device comprises a first heat transmission member disposed in the server module enclosure, a second heat transmission member disposed outside the server module enclosure, and first and second pipes that connect the first heat transmission member and the second heat transmission member,
   the first heat transmission member is a box body with an internal space for hermetically sealing a refrigerant therein, one external planar face of the box body being thermally connected to the CPU, and the other external planar face opposite thereto being provided with a heat sink that includes a heat sink fin and a heat sink basement,
   the second heat transmission member is disposed in the fan module unit, and a heat radiation member, which is provided for the first and second pipes, and the motherboard together form an airflow passage of the fan module, and
   a vaporized refrigerant flows from the first heat transmission member to the second heat transmission member through the first pipe, and a liquefied refrigerant flows from the second heat transmission member to the first heat transmission member through the second pipe,
   wherein the first pipe includes a vaporized-refrigerant outlet and a vaporized-refrigerant inlet with the vaporized-refrigerant outlet being disposed at a higher level than the vaporized-refrigerant inlet in a Z-axis direction in case that the cooling device is used with its XY plane positioned horizontally;
   wherein the second pipe includes liquefied-refrigerant outlet and a liquefied-refrigerant inlet with the liquefied-refrigerant outlet being disposed at a lower level than the liquefied-refrigerant inlet in the an X-axis direction in case that the cooling device is used with its ZY plane positioned horizontally;
   where the X-axis is perpendicular to the airflow from the heat sink basement to the tip of the heat sink fin, the Y-axis is in the direction of the airflow from the first transmission member to the second transmission member, and the Z-axis is perpendicular to the airflow in the direction from the second pipe to the first pipe.

2. The blade server according to claim 1, wherein:
   the server module enclosure and the fan module unit are disposed with an electronic substrate interposed therebetween, the electronic substrate electrically connecting the server module and the fan module, and the second heat transmission member is adapted to be disposed in the fan module unit.

3. The blade server according to claim 1 or 2, wherein:

the first and second pipes are a vapor transfer pipe and a liquid transfer pipe, respectively, which are disposed in parallel with each other, and the vapor transfer pipe and the liquid transfer pipe are partially connected to each other between the first heat transmission member and the second heat transmission member.

4. The blade server according to any one of claims 1 to 3, wherein the heat radiation member is a radiation fin or a radiation plate and is thermally connected to the vapor transfer pipe.

5. The blade server according to claim 1, wherein the first heat transmission member is an evaporator and the second heat transmission member is a condenser.

6. The blade server according to claim 1, wherein the length of the heat sink fin is smaller that offset of the vaporized-refrigerant inlet port from the horizontal portion of the first pipe.

7. The blade server according to claim 1, wherein the diameter of the vaporized-refrigerant inlet port of the first pipe is smaller that the width of the heat sink basement.

* * * * *